United States Patent
Itabashi et al.

(10) Patent No.: US 10,396,719 B2
(45) Date of Patent: Aug. 27, 2019

(54) INTEGRATED CIRCUIT DEVICE

(71) Applicant: SUMITOMO ELECTRIC INDUSTRIES, LTD., Osaka (JP)

(72) Inventors: Naoki Itabashi, Osaka (JP); Taizo Tatsumi, Osaka (JP)

(73) Assignee: Sumitomo Electric Industries, LTD, Osaka (JP)

( * ) Notice: Subject to any disclaimer, the term of this patent is extended or adjusted under 35 U.S.C. 154(b) by 0 days.

(21) Appl. No.: 15/988,403

(22) Filed: May 24, 2018

(65) Prior Publication Data
US 2018/0342987 A1 Nov. 29, 2018

(30) Foreign Application Priority Data

May 25, 2017 (JP) .................................. 2017-103426

(51) Int. Cl.
| | |
|---|---|
| H03F 1/30 | (2006.01) |
| G01R 1/067 | (2006.01) |
| H03F 3/45 | (2006.01) |
| G01R 19/10 | (2006.01) |
| H03F 1/52 | (2006.01) |

(52) U.S. Cl.
CPC ........... H03F 1/30 (2013.01); G01R 1/06766 (2013.01); G01R 19/10 (2013.01); H03F 1/52 (2013.01); H03F 3/45475 (2013.01); H03F 3/45484 (2013.01); H03F 3/45632 (2013.01); H03F 3/45928 (2013.01); *H03F 2200/444* (2013.01); *H03F 2203/45101* (2013.01); *H03F 2203/45612* (2013.01)

(58) Field of Classification Search
CPC ........................................................ H03F 1/30
See application file for complete search history.

(56) References Cited

U.S. PATENT DOCUMENTS

| | | | | |
|---|---|---|---|---|
| 3,432,764 A | * | 3/1969 | Kermicle | G01R 5/28 324/123 R |
| 5,075,634 A | * | 12/1991 | French | H03F 3/2173 330/10 |
| 6,008,698 A | * | 12/1999 | Dacus | H03F 1/0211 330/279 |

(Continued)

FOREIGN PATENT DOCUMENTS

JP  2006-215038  8/2006

*Primary Examiner* — Patricia T Nguyen
(74) *Attorney, Agent, or Firm* — Smith, Gambrell & Russell, LLP

(57) ABSTRACT

A circuit device includes a differential circuit including differential input terminals; a differential amplifier circuit in which differential input nodes are connected to the differential input terminals; a first power supply terminal supplied with a first voltage; a second power supply terminal supplied with a second voltage; a common terminal; a first resistive element of which one end is connected to one differential input terminal and another end is connected to the common terminal; a second resistive element of which one end is connected to the first supply terminal and another end is connected to the common terminal; a third resistive element of which one end is connected to one differential input terminal and another end is connected to the second supply terminal; a bonding wire, and a capacitor of which one end is connected to the second supply terminal and another end is connected to the common terminal.

5 Claims, 4 Drawing Sheets

(56) References Cited

U.S. PATENT DOCUMENTS

| | | | | |
|---|---|---|---|---|
| 6,653,902 B1* | 11/2003 | Bachhuber | ............. | H03F 1/302 |
| | | | | 330/285 |
| 2009/0319212 A1* | 12/2009 | Cech | .................. | B60R 21/0136 |
| | | | | 702/65 |
| 2012/0039487 A1* | 2/2012 | Sakai | ........................ | H03F 1/52 |
| | | | | 381/104 |
| 2018/0375482 A1* | 12/2018 | Gabai | ....................... | H03F 1/56 |

* cited by examiner

INTEGRATED CIRCUIT DEVICE

TECHNICAL FIELD

An aspect of the invention relates to an integrated circuit device and more particularly to an integrated circuit device including, for example, a differential amplifier circuit in which a pair of differential input terminals are terminated by resistive elements.

BACKGROUND

A differential circuit that processes a differential signal as a countermeasure against common-mode noise is used for communication systems dealing with a high-frequency signal or a high-speed signal. A transmission line having a specific characteristic impedance is used to transmit a high-frequency signal or a high-speed signal. A receiving end of a transmission line is terminated by a resistive element (a termination resistor) having a resistance equal to the characteristic impedance of the transmission line. For example, in an optical-communication system, an integrated circuit includes a differential circuit and a pair of differential input terminals connected to the differential circuit, and a pair of transmission lines is connected to the pair of differential input terminal. Each differential input terminal is terminated to a termination voltage by a termination resistor having a resistance (for example, 50Ω) equal to the characteristic impedance of the transmission line that transmits an input signal to the corresponding differential input terminal Alternatively, the differential input terminals are terminated to a center potential of a differential signal so that a resistance between one terminal and the other terminal of the differential input terminals becomes double of the characteristic impedance (for example, 100Ω). In such an integrated circuit, when the center voltage is generated from a supply voltage by a voltage drop of the resistive element and a resistance of the resistive element is set to be a large value, electrostatic discharge (ESD) resistance of the differential input terminals may relatively decrease.

SUMMARY

An integrated circuit device according to an aspect of the invention includes: a differential circuit including a pair of differential input terminals, an amplifier circuit including a pair of differential input nodes, one of the pair of differential input nodes being electrically connected to one of the pair of differential input terminals and another of the pair of differential input nodes being electrically connected to another of the pair of differential input terminal, a first supply terminal being configured to be applied a first voltage to from outside, a second supply terminal being configured to be applied a second voltage lower than the first voltage to from the outside, a common terminal, a first resistive element having one end and another end, the one end of the first resistive element being electrically connected to the one of the pair of differential input terminals and the another end of the first resistive element being electrically connected to the common terminal, a second resistive element having one end and another end, the one end of the second resistive element being electrically connected to the first supply terminal and the other end of the second resistive element being electrically connected to the common terminal, and a third resistive element having one end and another end, the one end of the third resistive element being electrically connected to the one of the pair of differential input terminals and the other end of the third resistive element being electrically connected to the second supply terminal; a bonding wire; and a capacitor having one end and another end, the another end of the capacitor being electrically connected to the common terminal by the bonding wire and the one end of the capacitor being electrically connected to the second power supply terminal.

DETAILED DESCRIPTION

A specific example of an integrated circuit device according to an embodiment of the present invention will be described below with reference to the accompanying drawings. In description with reference to the drawings, the same or corresponding elements will be referred to by the same reference signs and duplicate description will be appropriately omitted. The present invention is not limited to the example, but is defined by the appended claims, and is intended to include all modifications within the meaning and scope equivalent to the claims.

Figure 1:
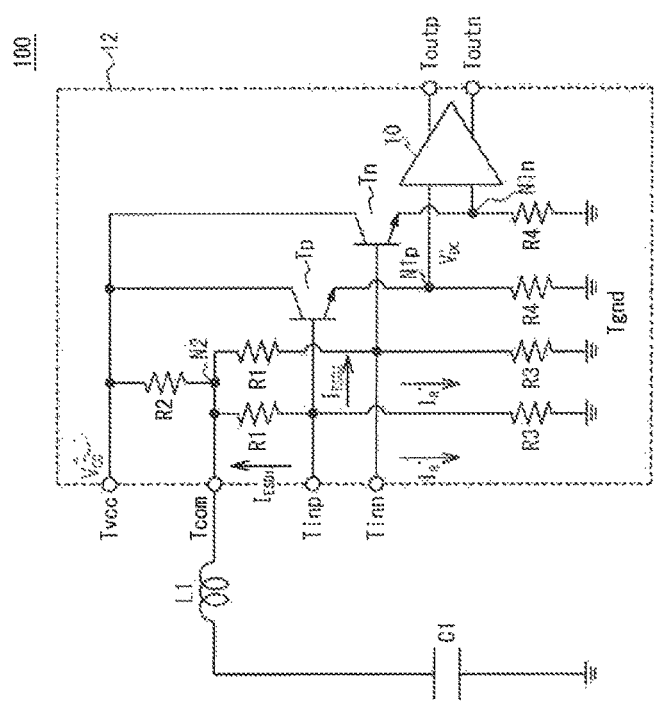
FIG. 1 is a circuit diagram illustrating a differential circuit formed in an integrated circuit device according to an embodiment.

FIG. 1 is a circuit diagram illustrating a differential circuit formed in an integrated circuit device according to an embodiment of the present invention. As illustrated in FIG. 1, a differential circuit 100 includes a pair of differential input terminals Tinp and Tinn, a common terminal Tcom, a pair of differential output terminals Toutp and Toutn, a supply terminal Tvcc, transistors Tp and Tn, resistive elements R1, R2, R3, R4, and a differential amplifier circuit 10. The differential circuit 100 is formed, for example, in a semiconductor chip 12. The differential input terminals Tinp and Tinn, the common terminal Tcom, the differential output terminals Toutp and Toutn, and the supply terminal Tvcc have respective bonding pads (metal electrodes) which are formed, for example, on the semiconductor chip 12. One Tinp of the differential input terminals is electrically connected to the base (control terminal) of the transistor Tp. The other Tinn of the differential input terminals is electrically connected to the base (control terminal) of the transistor Tn. Each of the differential input terminals Tinp and Tinn is electrically connected to a node N2 via the resistive elements R1. The node N2 is electrically connected to a supply line Vcc via the resistive element R2. The supply line Vcc is electrically connected to the supply terminal Tvcc. Each of the differential input terminals Tinp and Tinn is connected to a ground terminal Tgnd via the resistive element R3. A supply voltage VCC is supplied to the supply terminal Tvcc, for example, from an external power supply (not illustrated). The ground terminal Tgnd is electrically connected to, for example, an external ground line (not illustrated) and is grounded. The node N2 is electrically connected to the common terminal Tcom. An inductor L1 and a capacitor C1 are connected in series between the common terminal Tcom and the ground line.

Figure 2A:
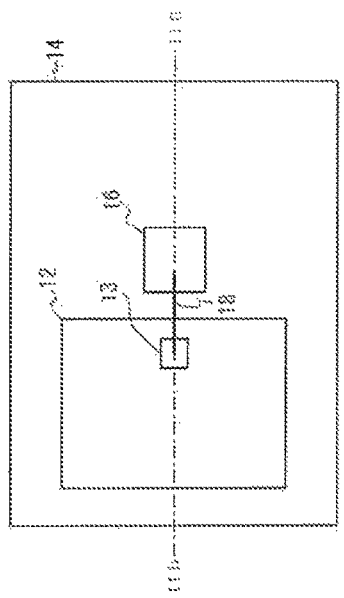
FIG. 2A is a plan view illustrating the integrated circuit device according to the embodiment.
Figure 2B:
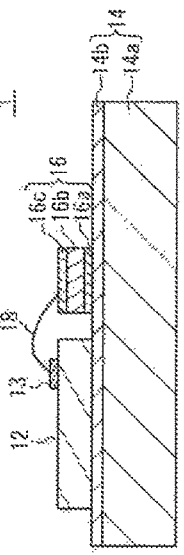
FIG. 2B is a cross-sectional view taken along line IIB-IIB of FIG. 2A.

FIG. 2A is a plan view illustrating the integrated circuit device according to the embodiment of the present invention. FIG. 2B is a cross-sectional view taken along line IIB-IIB of FIG. 2A. As illustrated in FIGS. 2A and 2B, the integrated circuit device 1 includes the semiconductor chip 12, a bonding pad 13, a mounting substrate 14, a capacitor 16, and a bonding wire 18. The semiconductor chip 12 and the capacitor 16 (a die cap capacitor) are mounted on a planer mounting surface of the mounting substrate 14. A lower side of the semiconductor chip 12 and a lower side of the capacitor 16 contact with the planer mounting surface of the mounting substrate 14. The mounting substrate 14 includes an insulating substrate 14a and a ground metal layer 14b that is provided on the insulating substrate 14a. The insulating substrate 14a is, for example, a resin substrate or a ceramic substrate. The ground metal layer 14b is, for example, a gold layer, an aluminum layer, or a copper layer. The insulating substrate 14a may further include another insulating substrate and another ground metal layer to form a multilayer substrate.

A bonding pad 13 (a metal electrode) is provided on an upper side (first surface) of the semiconductor chip 12. The semiconductor chip 12 includes, for example, an InP substrate. The bonding pad 13 includes a metal layer such as a gold layer, an aluminum layer, or a copper layer. The capacitor 16 includes electrodes 16a and 16c and a dielectric layer 16b interposed therebetween. The electrodes 16a and 16c are metal layers such as a gold layer, an aluminum layer, or a copper layer. The dielectric layer 16b is, for example, a ceramic layer. The electrode (one end) 16a is electrically connected and fixed to the ground metal layer 14b using a conductive adhesive or the like. The ground metal layer 14b may be biased by a second supply voltage which supply is lower than the first supply voltage. The electrode (another end) 16c and the bonding pad 13 are connected to each other by a bonding wire 18. The bonding wire 18 is, for example, a metal wire such as a gold wire, an aluminum wire, or a copper wire.

The bonding pad 13, the chip capacitor 16, and the bonding wire 18 correspond to the common terminal Tcom, the capacitor C1, and the inductor L1, respectively.

The differential circuit 100 will be described now with reference back to FIG. 1. The collectors (first current terminals) of the transistors Tp and Tn are electrically connected to the supply terminal Tvcc via the supply lines Vcc. The emitters (second current terminals) of the transistors Tp and Tn are each electrically connected to the ground potential (the ground terminal Tgnd) via the resistive elements R4. The nodes N1p and N1n between the emitters of the transistors Tp and Tn and the resistive elements R4 are connected to differential input nodes of the differential amplifier circuit 10. Differential output nodes of the differential amplifier circuit 10 are connected to the differential output terminals Toutp and Toutn.

The transistors Tp and Tn constitute an emitter follower circuit. For example, bias voltages of the differential input terminals Tinp and Tinn are converted into (level-shifted to) an input bias voltage $V_{DC}'$ of the differential amplifier circuit 10.

The resistive element R1 is a termination resistor and the resistance of the resistive element R1 is equal to a characteristic impedance of transmission lines connected to the differential input terminals Tinp and Tinn, for example, 50Ω. Two resistive elements R1 are connected in series between the differential input terminals Tinp and Tinn and a resistance between the differential input terminals Tinp and Tinn is double of the characteristic impedance, for example, to 100Ω. The resistance of the resistive element R3 is larger than the resistance of the resistive element R1 (for example, the resistance of the resistive element R3 is 3 kΩ). Accordingly, it is possible to reduce a current $I_R'$ which flows from the node N2 to the ground terminal Tgnd via one resistive element R1 and one resistive element R3 connected in series to the resistive element R1. Accordingly, it is possible to reduce power consumption necessary for the termination. The resistance of the resistive element R4 is set to supply a current necessary for the emitter follower circuit (for example, the resistance of the resistive element R4 is 1 kΩ). The current necessary for the emitter follower circuit can be determined depending on an amount of level shift of a signal from the input (the bases of the transistors Tp and Tn) of the emitter follower circuit to the output (the emitters of the transistors Tp and Tn) thereof.

The input impedance of the bases of the transistors Tp and Tn is sufficiently larger than that of the resistive element R3. Accordingly, the bias voltages of the differential input terminals Tinp and Tinn are determined as a ratio of resistance values of the resistive elements R1 and R3. The bias voltages $V_{DC}'$ of the nodes N1p and N1n become a value obtained by subtracting the base-emitter voltages VBE of the transistors Tp and Tn from the bias voltages of the differential input terminals Tinp and Tinn (VN2−R1×$I_R'$), that is, $V_{DC}'$=VN2−R1×$I_R'$−VBE. Here, VN2 is a voltage of the node N2 (a termination voltage).

The supply voltage VCC supplied from the outside to the supply terminal Tvcc is fixed to, for example, a constant value between 1.5 V and 6 V.

In the differential circuit 100, the ends of one side of the two resistive elements R1 are both connected to the node N2. The node N2 is connected to the supply line Vcc via the resistive element R2. For example, it is assumed that the resistance of the resistive element R2 is set to be smaller than the resistance of the resistive element R3 and to be comparable to the resistance of the resistive element R1 (for example, 200Ω). The voltage VN2 of the node N2 is lower than the supply voltage VCC by a voltage drop which is caused by a current 2×$I_R'$ flowing in the resistive element R2. Accordingly, the bias voltages of the differential input terminals Tinp and Tinn are VN2−R1×$I_R'$=VCC−R2×2×$I_R'$−R1×$I_R'$. Accordingly, $V_{DC}'$=VCC−R2×2×$I_R'$−R1×$I_R'$−VBE is established. The current $I_R'$ is calculated as VCC/(R2+(R1+R3)/2).

Figures 3, 4:
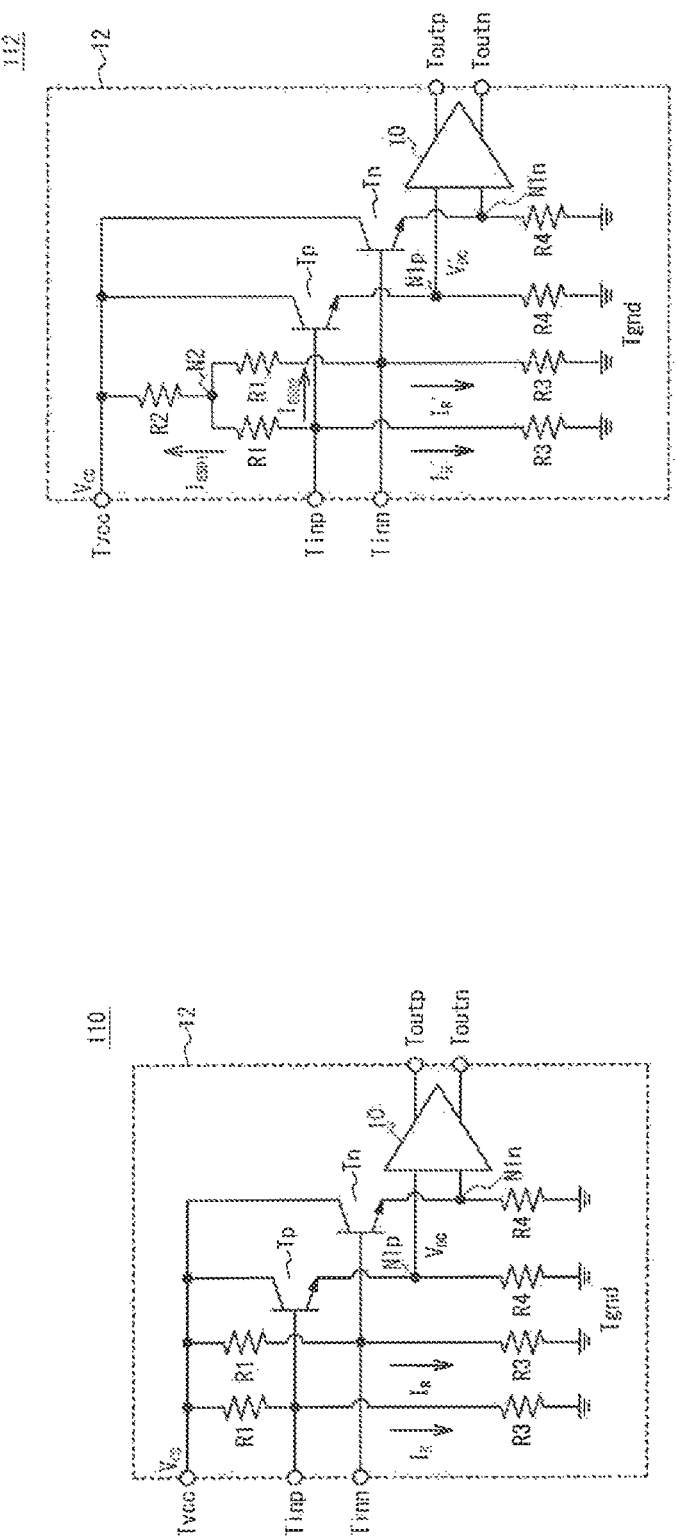
FIG. 3 is a circuit diagram illustrating a differential circuit according to Comparative Example 1.
FIG. 4 is a circuit diagram illustrating a differential circuit according to Comparative Example 2.

FIG. 3 is a circuit diagram illustrating a differential circuit 110 according to Comparative Example 1. The differential circuit 110 according to Comparative Example 1 is different from the differential circuit 100 according to the embodiment in that the resistive element R2, the common terminal Tcom, the inductor L1, and the capacitor C1 are not provided. The bias voltage $V_{DC}$ of the differential input terminals Tinp and Tinn in Comparative Example 1 can be calculated as a bias voltage $V_{DC}'$ when the resistance of the resistive element R2 in the differential circuit 100 according to the embodiment is set to 0Ω and the termination voltage is set to VCC. That is, the bias voltage $V_{DC}$ is $V_{DC}$=VCC−R1×$I_R$−VBE. By providing the resistive element R2, the bias voltage $V_{DC}'$ in the embodiment is lower than the bias voltage $V_{DC}$ in Comparative Example 1 by substantially R2×2×$I_R'$. For example, when the resistance values of the resistive elements R1, R2, and R3 are 50Ω, 200Ω, and 3 kΩ and the supply voltage VCC is 3 V, the bias voltage $V_{DC}'$ can be set to be lower than the bias voltage $V_{DC}$ by about 370 mV. In this way, in the differential circuit 100 according to the embodiment, the input bias voltage of the differential amplifier circuit 10 can be decreased by adjusting the resistance of the resistive element R2. The current $I_R$ in Comparative Example 1 is VCC/((R1+R3)/2). Accordingly, since the current $I_R'$<the current $I_R$ is established, the differential circuit 100 can reduce power consumption and set the input bias voltage of the differential amplifier circuit 10 to be lower.

Comparative Example 2 will be described below. FIG. 4 is a circuit diagram illustrating a differential circuit 112 according to Comparative Example 2. The differential circuit 112 according to Comparative Example 2 is different from the differential circuit 100 according to the embodiment, in that the common terminal Tcom, the inductor L1, and the capacitor C1 are not provided.

According to Comparative Example 2, the differential input terminals Tinp and Tinn are differentially terminated by two resistive elements R1, and high-frequency characteristics for the differential input terminals Tinp and Tinn are basically the same as those in Comparative Example 1. However, since the differential input terminals Tinp and Tinn are electrically connected to the supply terminal Tvcc via the resistive elements R1 and R2, high-frequency characteristics in phase (in a common mode) are deteriorated in comparison with Comparative Example 1.

In Comparative Examples 1 and 2, when an ESD voltage was applied to the input terminal Tinp, a current $I_{ESD1}$ flowing from the input terminal Tinp to the supply terminal Tvcc and a current $I_{ESD2}$ flowing from the input terminal Tinp to the base of the transistor Tp were simulated.

An ESD voltage was set to 100 V based on the assumption of a human body model. The human body model was based on Japanese Industrial Standard JIS C61340-3-1: 2010 "Static Electricity—Part 3-1: Method of simulating influence of static electricity—Electrostatic discharge test waveform of human body model (HBM)." The supply voltage VCC was set to 3.3 V and the resistance values of the resistive elements R1, R2, and R3 were set to 50Ω, 200Ω, and 3 kΩ, respectively. InP-based heterojunction bipolar transistors (HBT) were used as the transistors Tp and Tn.

Figure 5A:
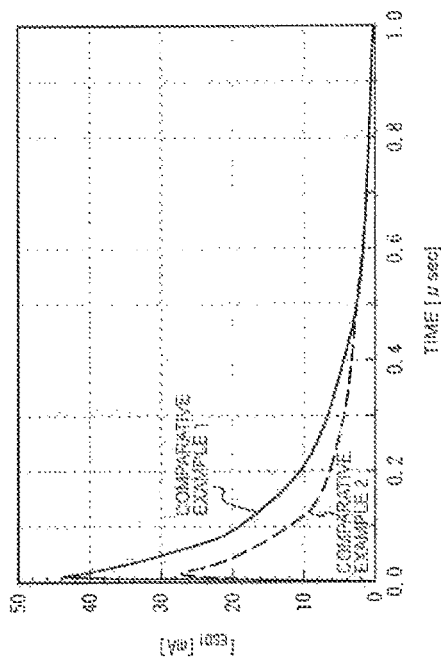
FIG. 5A is a diagram illustrating transient change of an ESD current ($I_{ESD1}$) in differential input terminals according to Comparative Examples 1 and 2.
Figure 5B:
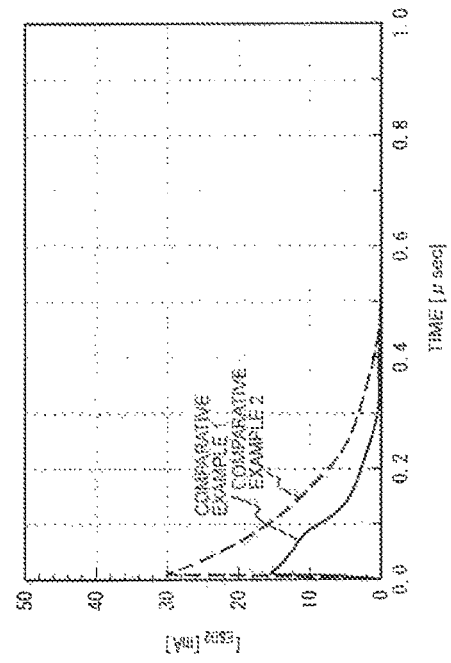
FIG. 5B is a diagram illustrating transient change of an ESD current ($I_{ESD2}$) in differential input terminals according to Comparative Examples 1 and 2.

FIGS. 5A and 5B are diagrams illustrating transient change of an ESD current in the differential circuits according to Comparative Example 1 and Comparative Example 2. As illustrated in FIGS. 5A and 5B, when an ESD voltage is applied, the ESD currents $I_{ESD1}$ and $I_{ESD2}$ instantaneously increase rapidly and then decrease with the lapse of time. The maximum $I_{ESD1}$ in Comparative Example 1 is about 28 mA and the maximum $I_{ESD1}$ in Comparative Example 2 is about 44 mA. The maximum $I_{ESD2}$ in Comparative Example 1 is about 16 mA and the maximum $I_{ESD2}$ in Comparative Example 2 is about 30 mA.

In Comparative Example 2, about twice $I_{ESD2}$ flows to the base of the transistor Tp in comparison with Comparative Example 1. This is because $I_{ESD1}$ flowing from the input terminal Tinp to the supply terminal Tvcc in the differential circuit 112 according to Comparative Example 2 is decreased by the resistive element R2 in comparison with the differential circuit 110 according to Comparative Example 1. Metal resistors or semiconductor resistors are used as the resistive elements R1 to R3. In the resistive elements R1 and R2, it is easy to provide ESD resistance by increasing a lateral width along a direction perpendicular to a current flowing direction in the metal resistor or the semiconductor resistor. On the other hand, in the transistors Tp and Tn, a micro element structure is included for the purpose of implementation of high-speed performance and it is not easy to provide ESD resistance thereto. In this way, the transistors Tp and Tn have less ESD resistance than the resistive elements R1 and R2. Accordingly, the transistors Tp and Tn in the differential circuit 112 according to Comparative Example 2 may relatively deteriorate due to the lower ESD compared to the differential circuit 110 according to Comparative Example 1.

As described above, in the differential circuit 112 according to Comparative Example 2, the input bias voltage of the differential amplifier circuit 10 (the bias voltage of the nodes N1p and N1n) can be decreased from the voltage $V_{DC}$ to the voltage $V_{DC}'$ in comparison with the differential circuit 110 according to Comparative Example 1. The high-frequency characteristics for the differential input terminals Tinp and Tinn are almost the same as those in Comparative Example 1. However, the ESD resistance of the differential circuit 112 may relatively decrease in comparison with that of the differential circuit 110. The high-frequency characteristics in phase (in a common mode) may relatively deteriorate in the differential circuit 112.

Figure 6:
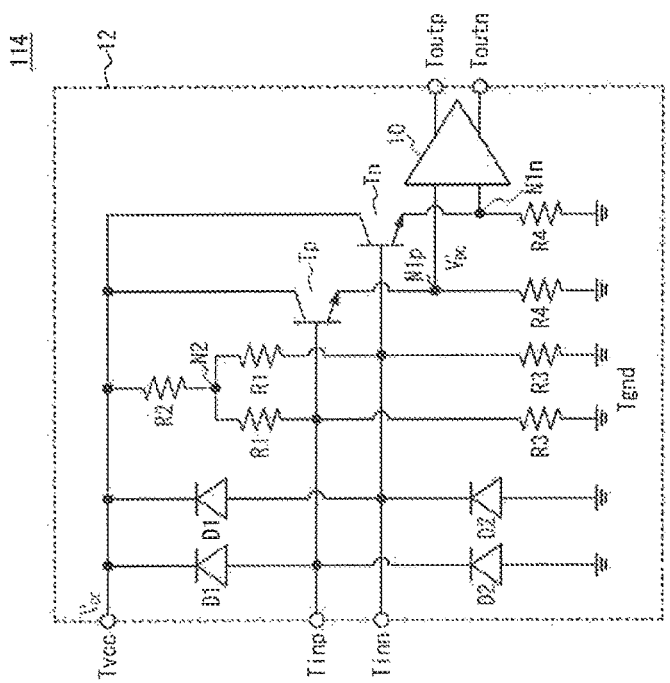
FIG. 6 is a circuit diagram illustrating a differential circuit according to Comparative Example 3.

Comparative Example 3 will be additionally described next. FIG. 6 is a circuit diagram illustrating a differential circuit according to Comparative Example 3. As illustrated in FIG. 6, a differential circuit 114 according to Comparative Example 3 is different from the differential circuit 100 according to the embodiment in that the common terminal Tcom, the inductor L1, and the capacitor C1 are not provided, diodes D1 are connected between the input terminals Tinp and Tinn and the supply terminal Tvcc so that the diodes are reversely biased in a normal operating state, and diodes D2 are connected between the input terminals Tinp and Tinn and the ground terminal Tgnd so that the diodes are reversely biased in the normal operating state. When an ESD voltage is applied to the input terminals Tinp and Tinn, an ESD current flows to the power supply terminal Tvcc or the ground terminal Tgnd via the diodes D1 or D2. Accordingly, it is possible to reduce the ESD currents flowing in the transistors Tp and Tn.

However, capacitances (parasitic capacitances) of the diodes D1 and D2 are added to the input terminals Tinp and Tinn. Accordingly, transmission characteristics and reflection characteristics of high-frequency signals (which include high-speed signals) which are input to the input terminals Tnip and Tinn deteriorate. Reflection characteristics SDD11 and transmission characteristics SDD21 of differential signals in Comparative Example 2 and Comparative Example 3 were simulated.

Figure 7A:
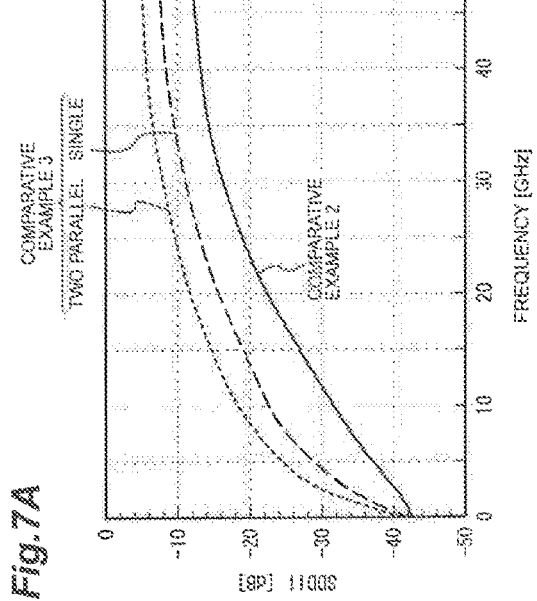
FIG. 7A is a diagram illustrating frequency characteristics of reflection characteristics in the differential circuits according to Comparative Examples 2 and 3.
Figure 7B:
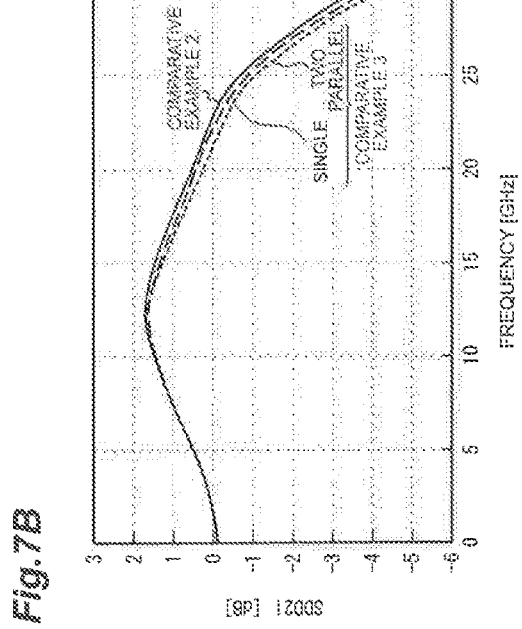
FIG. 7B is a diagram illustrating frequency characteristics of transmission characteristics in the differential circuits according to Comparative Examples 2 and 3.

FIGS. 7A and 7B are diagrams illustrating frequency characteristics of reflection characteristics and transmission characteristics in the differential circuits according to Comparative Example 2 and Comparative Example 3. In Comparative Example 3, simulation was performed for a "single" diode and "two parallel" diodes. In "single," as illustrated in FIG. 6, single diodes D1 are connected between the differential input terminals Tinp and Tinn and the power supply terminal Tvcc, and single diodes D2 are connected between the differential input terminals Tinp and Tinn and the ground terminal Tgnd. In "two parallel," double diodes D1 are connected in parallel between the differential input terminals Tinp and Tinn and the power supply terminal Tvcc, and double diodes D2 are connected in parallel between the differential input terminals Tinp and Tinn and the ground terminal Tgnd. The diodes D1 and D2 were formed by diode-connecting the base and the collector of an InP-based HBT, and an allowable current density thereof was set to several mA/$\mu$m$^2$. For example, as for the diode D2, the base and the collector of the InP-based HBT are connected to the ground terminal Tgnd and the emitter of the InP-based HBT is connected to the differential input terminal Tinp or Tinn.

As illustrated in FIG. 7A, an input signal is reflected more in Comparative Example 3 than in Comparative Example 2. Particularly, in "two parallel," the reflection characteristics deteriorate greatly. Here, a larger value is worse. For example, when SDD11 at 20 GHz is required to be equal to or less than −20 dB, "single" and "two parallel" in Comparative Example 3 do not satisfy the required SDD11. As illustrated in FIG. 7B, the transmission characteristics in Comparative Example 3 have a larger loss than those in Comparative Example 2. Particularly, in "two parallel," the transmission characteristics deteriorate greatly.

As described above, the ESD resistance in Comparative Example 3 is improved, but the reflection characteristics at a high frequency of the differential signals deteriorate.

Advantages of the embodiment will be described below. In Example 1 which corresponds to the embodiment, similarly to Comparative Examples 1 and 2, currents $I_{ESD1}$ and $I_{ESD2}$ which flow when an ESD voltage is applied to the input terminal Tinp were simulated. The capacitance of the capacitor C1 was set to 10 nF, and the inductance and the equivalent series resistance of the inductor L1 were set to 300 pF and 5$\Omega$.

Figure 8A:
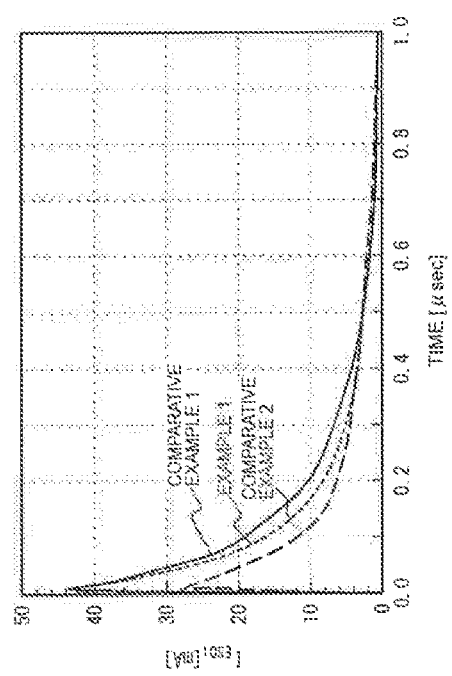
FIG. 8A is a diagram illustrating transient change of an ESD current ($I_{ESD1}$) in the differential circuits according to the embodiment and Comparative Examples 1 and 2.
Figure 8B:
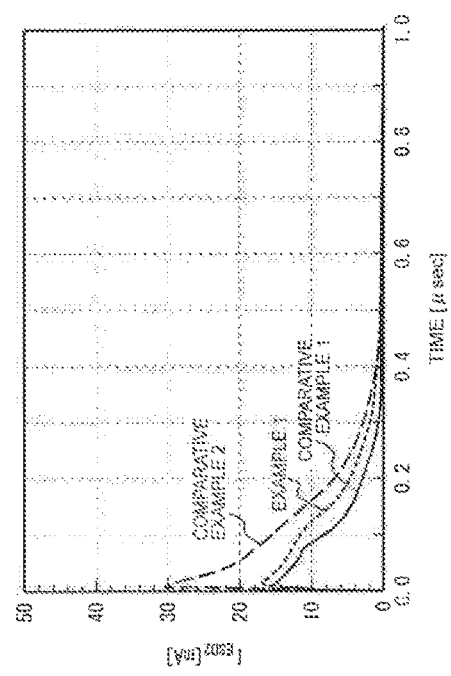
FIG. 8B is a diagram illustrating transient change of an ESD current ($I_{ESD2}$) in the differential circuits according to the embodiment and Comparative Examples 1 and 2.

FIGS. 8A and 8B are diagrams illustrating transient change of an ESD current in the differential circuits according to Example 1, Comparative Example 1, and Comparative Example 2. As illustrated in FIGS. 8A and 8B, the ESD currents $I_{ESD1}$ and $I_{ESD2}$ in Example 1 are almost the same as in Comparative Example 1, and the ESD current $I_{ESD2}$ which is input to the bases of the transistors Tp can be reduced. This is because a path extending from the common terminal Tcom to the ground via the inductor L1 and the capacitor C1 has a low impedance at the frequency components of the ESD current. Increasing the ESD current $I_{ESD1}$ to flow to the ground via the common terminal Tcom as much as possible allows the ESD resistance to be more improved. Accordingly, it is preferable that the length of the bonding wire 18 be decreased and the inductor L1 be reduced.

Since the differential input terminals Tinp and Tinn are differentially terminated by two resistive elements R1 connected in series to each other, the high-frequency characteristics of the differential signals are not affected even if the capacitor C1 is connected to the common terminal Tcom. Particularly, when the potential of the node N2 is matched with the center potential of the differential signals which are input to the differential input terminals Tinp and Tinn, the voltage of the node N2 becomes constant and thus the capacitor C1 does not affect the high-frequency characteristics of the reflection characteristics or the transmission characteristics. The capacitor C1 between the common terminal Tcom and the ground has a low impedance sufficient with respect to a high-frequency signal. Accordingly, the influence of the resistive element R2 is reduced and the differential input terminals Tinp and Tinn are terminated by substantially the resistive elements R1 for the high-frequency component of the differential signals. Accordingly, it is possible to mitigate deterioration of the high-frequency characteristics (for example, reflection characteristics) in the common mode.

As described above, according to the embodiment (Example 1), a pair of input nodes N1$p$ and N1$n$ of the differential amplifier circuit 10 are electrically connected to a pair of input terminals Tinp and Tinn. Ends on one side (first terminals) of the pair of resistive elements R1 (first resistive elements) are electrically connected to the pair of input terminals Tinp and Tinn, and ends on the other side (second terminals) of the pair of resistive elements R1 are connected to the common terminal Tcom. One end (a first terminal) of the resistive element R2 (a second resistive element) is connected to the common terminal Tcom, and the other end (a second terminal) of the resistive element R2 is electrically connected to the supply terminal Tvcc (a first power supply terminal). Ends on one side (first terminals) of the pair of resistive elements R3 (third resistive elements) are electrically connected to the pair of input terminals Tinp and Tinn, and ends on the other side (second terminals) of the pair of resistive elements R3 are electrically connected to the ground terminal (or a second supply terminal which is supplied with a voltage (second voltage) other than that of the first supply terminal). Namely, the second supply terminal may be the ground terminal Tgnd and the second voltage may be the ground potential (0 V). Accordingly, it is possible to lower the input bias voltage of the differential circuit without substantially changing the supply voltage in comparison with the differential circuit 110 according to Comparative Example 1.

One end (a first terminal) of the capacitor C1 is connected to the common terminal Tcom, and the other end (a second terminal) of the capacitor C1 is electrically connected to a reference potential (for example, the ground potential via the ground terminal Tgnd). The reference potential may be provided, for example, on the ground metal layer 14$b$. The electrode 16$a$ of the capacitor C1 is electrically connected to the ground metal layer 14$b$, for example, by conductive surface contact. The ground terminal Tgnd on the semiconductor chip 12 can be connected to the ground metal layer 14$b$ by wire bonding. Accordingly, since the common terminal Tcom is grounded with a low impedance at a high frequency, it is possible to secure higher ESD resistance than that of the differential circuit 112 according to Comparative Example 2. The high-frequency characteristics of the reflection characteristics and the transmission characteristics do not deteriorate further in comparison with the differential circuit 114 according to Comparative Example 3.

Connecting a diode to the common terminal Tcom instead of the capacitor C1 can be considered. However, a diode may be formed by, for example, a transistor in the semiconductor chip 12. Accordingly, increasing an area of the semiconductor chip 12 causes production cost thereof to increase. Therefore, it is preferable that the capacitor C1 or an equivalent electric part be connected to the common terminal Tcom.

More specifically, in order to secure a low impedance between the common terminal Tcom and the ground terminal at a high frequency band, the capacitance of the capacitor C1 has to have a large value and is preferably equal to or greater than 1 nF and more preferably equal to or greater than 5 nF. When such a capacitor C1 is provided in the semiconductor chip 12, the area of the capacitor C1 increases and the chip costs increase.

Therefore, as illustrated in FIGS. 2A and 2B, the semiconductor chip 12 and the capacitor (the die cap) are mounted on the planer mounting surface of the mounting substrate 14. The semiconductor chip 12 and the capacitor are mounted on the same surface (planer mounting surface) of the mounting substrate 14. The common terminal Tcom and one end of the capacitor C1 are connected to each other by a bonding wire. Accordingly, the capacitor C1 may not be provided in the semiconductor chip. Therefore, it is possible to suppress an increase in costs due to an increase in the chip area of the semiconductor chip 12 and to decrease the costs.

Since an ESD current flows to the ground via the capacitor C1, the inductance of the inductor L1 and the equivalent series resistance are preferably smaller. Accordingly, the bonding wire 18 is preferably shorter. In order to decrease the inductance and the equivalent series resistance, a plurality of bonding wires 18 may be provided in parallel to each other between the bonding pad 13 and the chip capacitor 16.

The bases (control terminals) of a pair of transistors Tp and Tn are electrically connected to a pair of differential input terminals Tinp and Tinn and terminals on one side of a pair of resistive elements R1. When the differential input terminals Tinp and Tinn are connected to the bases of the transistors Tp and Tn, an ESD current flows into the bases of the transistors Tp and Tn and the transistors Tp and Tn may be damaged by rapid generation of heat due to the ESD current. Accordingly, the ESD resistance may deteriorate. Therefore, the capacitor C1 connected to the common terminal Tcom prevents the ESD current from flowing into the bases of the transistors Tp and Tn and to mitigate deterioration of the ESD resistance.

The collectors (first terminals) of the pair of transistors Tp and Tn are connected to the supply terminal Tvcc and the emitters (second terminals) thereof are connected to the pair of input nodes N1p and N1n of the differential amplifier circuit 10. In this way, when the pair of transistors Tp and Tn are connected to form an emitter follower, the ESD current flows into the bases of the transistors Tp and Tn, and the transistors Tp and Tn may be damaged. Therefore, the capacitor C1 connected to the common terminal Tcom prevents the ESD current from flowing into the bases of the transistors Tp and Tn and to mitigate deterioration of the ESD resistance.

Bipolar transistors have been exemplified as the transistors Tp and Tn, but the transistors Tp and Tn may be field effect transistors (FETs). In this case, a gate, a drain, and a source serve as the control terminal, the first terminal, and the second terminal The emitter follower connection is replaced with a source follower connection. Since the gate of an FET has an insulating structure in comparison with a bipolar transistor, it can be expected to cause better improvement effects by causing the ESD current to flow into the common terminal Tcom.

The resistance of the resistive element R3 is greater than the resistances of the resistive element R1 and the resistive element R2. Accordingly, it is possible to decrease a current $I_R$ flowing from the supply terminal Tvcc to the ground terminal Tgnd via the resistive elements R1 to R3. As a result, it is possible to reduce power consumption with mitigating deterioration of the ESD resistance.

It should be understood that the above-disclosed embodiment is only an example in all respects, and is not restrictive. The scope of the invention is not defined by the above description, but is defined by the appended claims and is intended to include all modifications within meanings and scopes equivalent to the claims.

What is claimed is:

1. An integrated circuit device comprising:
    a differential circuit including
        a pair of differential input terminals,
        an amplifier circuit including a pair of differential input nodes, one node of the pair of differential input nodes being electrically connected to one terminal of the pair of differential input terminals and another node of the pair of differential input nodes being electrically connected to another terminal of the pair of differential input terminals,
        a first supply terminal configured to be supplied a first voltage from outside,
        a second supply terminal configured to be supplied a second voltage lower than the first voltage from the outside,
        a common terminal,
        a first resistive element having one end and another end, the one end of the first resistive element being electrically connected to the one terminal of the pair of differential input terminals and the another end of the first resistive element being electrically connected to the common terminal,
        a second resistive element having one end and another end, the one end of the second resistive element being electrically connected to the first supply terminal and the other end of the second resistive element being electrically connected to the common terminal, and
        a third resistive element having one end and another end, the one end of the third resistive element being electrically connected to the one terminal of the pair of differential input terminals and the other end of the third resistive element being electrically connected to the second supply terminal;
    a bonding wire; and
    a capacitor having one end and another end, the another end of the capacitor being electrically connected to the common terminal by the bonding wire and the one end of the capacitor being electrically connected to the second supply terminal.

2. The integrated circuit device according to claim 1, further comprising
    a semiconductor chip including a first surface and a second surface opposite to the first surface, wherein the differential circuit is formed on the first surface; and
    a mounting substrate including a planar mounting surface, wherein the second surface of the semiconductor chip and the one end of the capacitor are mounted on the mounting surface in contact therewith.

3. The integrated circuit device according to claim 2, further comprising an emitter follower circuit,
    wherein the one terminal of the pair of differential input terminals is electrically connected to the one node of the pair of differential input nodes via the emitter follower circuit.

4. The integrated circuit device according to claim 1, further comprising
    another first resistive element having one end and another end, the one end of the another first resistive element being electrically connected to the another terminal of the pair of differential input terminals and the another end of the another first resistive element being electrically connected to the common terminal; and another third resistive element having one end and another end, the one end of the another third resistive element being electrically connected to the another terminal of the pair of differential input terminals and the another end of the another third resistive element being electrically connected to the second supply terminal.

5. The integrated circuit device according to claim 1, wherein a resistance of the third resistive element is larger than a resistance of the first resistive element and a resistance of the second resistive element.

* * * * *